United States Patent
Kang et al.

(10) Patent No.: US 10,960,498 B2
(45) Date of Patent: Mar. 30, 2021

(54) COATED WIRE

(71) Applicants: Heraeus Materials Singapore Pte., Ltd., Techplace II (SG); Heraeus Oriental HiTec Co., Ltd., Incheon (KR)

(72) Inventors: Il Tae Kang, Kunsan (KR); Yong-Deok Tark, Incheon (KR); Mong Hyun Cho, Incheon (KR); Jong Su Kim, Incheon (KR); Hyun Seok Jung, Incheon (KR); Tae Yeop Kim, Seoul (KR); Xi Zhang, Thomson (SG); Murali Sarangapani, Singapore (SG)

(73) Assignees: HERAEUS MATERIALS SINGAPORE PTE., LTD., Singapore (SG); HERAEUS DEUTSCHLAND GMBH & CO. KG, Hanau (DE)

( * ) Notice: Subject to any disclaimer, the term of this patent is extended or adjusted under 35 U.S.C. 154(b) by 225 days.

(21) Appl. No.: 15/778,009

(22) PCT Filed: Sep. 16, 2016

(86) PCT No.: PCT/SG2016/000017
§ 371 (c)(1),
(2) Date: May 22, 2018

(87) PCT Pub. No.: WO2017/091144
PCT Pub. Date: Jun. 1, 2017

(65) Prior Publication Data
US 2018/0345421 A1    Dec. 6, 2018

(30) Foreign Application Priority Data
Nov. 23, 2015    (SG) ............................ 10201509634U

(51) Int. Cl.
*B23K 35/30* (2006.01)
*B23K 35/02* (2006.01)
(Continued)

(52) U.S. Cl.
CPC ........ *B23K 35/3006* (2013.01); *B23K 20/007* (2013.01); *B23K 35/0227* (2013.01);
(Continued)

(58) Field of Classification Search
None
See application file for complete search history.

(56) References Cited

U.S. PATENT DOCUMENTS 7,952,028 B2 * 5/2011 Uno ...................... B21C 37/047
174/94 R
2007/0235887 A1   10/2007 Kaimori et al.
(Continued)

FOREIGN PATENT DOCUMENTS

CN    104157625 A    11/2014
EP    2703116 A1    3/2014
(Continued)

OTHER PUBLICATIONS

Machine translation of WO 2013/018238 (translated Apr. 24, 2020 via google) (Year: 2013).*
(Continued)

*Primary Examiner* — David Sample
*Assistant Examiner* — Elizabeth Collister
(74) *Attorney, Agent, or Firm* — Blank Rome LLP

(57) ABSTRACT

A wire comprising a wire core with a surface, the wire core having a coating layer superimposed on its surface, wherein the wire core includes: (a) pure silver consisting of silver and further components; or (b) doped silver consisting of silver, at least one doping element, and further components; or (c) a silver alloy consisting of silver, palladium and further
(Continued)

components; or (d) a silver alloy consisting of silver, palladium, gold, and further components; or (e) a doped silver alloy consisting of silver, palladium, gold, at least one doping element, and further components, wherein the individual amount of any further component is less than 30 wt.-ppm and the individual amount of any doping element is at least 30 wt.-ppm, and the coating layer is a single-layer of gold or palladium or a double-layer comprised of an inner layer of nickel or palladium and an adjacent outer layer of gold.

16 Claims, 1 Drawing Sheet

(51) Int. Cl.

| | | |
|---|---|---|
| *C22C 5/06* | (2006.01) | |
| *H01L 23/00* | (2006.01) | |
| *C25D 5/12* | (2006.01) | |
| *C25D 5/50* | (2006.01) | |
| *C25D 7/06* | (2006.01) | |
| *C25D 5/10* | (2006.01) | |
| *C23C 28/02* | (2006.01) | |
| *B23K 20/00* | (2006.01) | |
| *C22F 1/00* | (2006.01) | |
| *C22F 1/02* | (2006.01) | |
| *C22F 1/14* | (2006.01) | |
| *C22C 5/08* | (2006.01) | |
| *B23K 35/40* | (2006.01) | |
| *C23C 14/02* | (2006.01) | |
| *C23C 14/16* | (2006.01) | |

(52) U.S. Cl.
CPC ........ *B23K 35/0261* (2013.01); *B23K 35/404* (2013.01); *C22C 5/06* (2013.01); *C22C 5/08* (2013.01); *C22F 1/002* (2013.01); *C22F 1/02* (2013.01); *C22F 1/14* (2013.01); *C23C 14/022* (2013.01); *C23C 14/165* (2013.01); *C23C 28/021* (2013.01); *C25D 5/10* (2013.01); *C25D 5/12* (2013.01); *C25D 5/50* (2013.01); *C25D 7/0607* (2013.01); *H01L 24/42* (2013.01); *H01L 24/43* (2013.01); *H01L 24/44* (2013.01); *H01L 24/45* (2013.01); *H01L 24/85* (2013.01); *H01L 2224/05624* (2013.01); *H01L 2224/43125* (2013.01); *H01L 2224/43848* (2013.01); *H01L 2224/45014* (2013.01); *H01L 2224/45015* (2013.01); *H01L 2224/45016* (2013.01); *H01L 2224/45139* (2013.01); *H01L 2224/45144* (2013.01); *H01L 2224/45164* (2013.01); *H01L 2224/45565* (2013.01); *H01L 2224/45572* (2013.01); *H01L 2224/45644* (2013.01); *H01L 2224/45655* (2013.01); *H01L 2224/45664* (2013.01); *H01L 2224/48511* (2013.01); *H01L 2224/85045* (2013.01); *H01L 2224/85205* (2013.01); *H01L 2924/00014* (2013.01); *H01L 2924/0102* (2013.01); *H01L 2924/01028* (2013.01); *H01L 2924/01029* (2013.01); *H01L 2924/01044* (2013.01); *H01L 2924/01045* (2013.01); *H01L 2924/01078* (2013.01)

(56) References Cited

U.S. PATENT DOCUMENTS

| | | | | |
|---|---|---|---|---|
| 2011/0120594 A1* | 5/2011 | Uno | ........... | B32B 15/018 |
| | | | | 148/23 |
| 2013/0171470 A1* | 7/2013 | Lee | ........... | C22F 1/14 |
| | | | | 428/672 |
| 2013/0233593 A1* | 9/2013 | Lee | ........... | H01B 13/30 |
| | | | | 174/126.2 |
| 2013/0233594 A1* | 9/2013 | Lee | ........... | H01B 13/30 |
| | | | | 174/126.2 |
| 2014/0063762 A1 | 3/2014 | Ryu et al. | | |
| 2015/0360316 A1* | 12/2015 | Milke | ........... | H01L 24/85 |
| | | | | 428/670 |
| 2016/0315063 A1* | 10/2016 | Uno | ........... | B32B 15/018 |

FOREIGN PATENT DOCUMENTS

| | | | | |
|---|---|---|---|---|
| JP | H01162343 A | 6/1989 | | |
| JP | 2005167020 A | 6/2005 | | |
| JP | 2014201797 A | 10/2014 | | |
| JP | 2014222725 A | 11/2014 | | |
| JP | 2015119004 A | 6/2015 | | |
| JP | 2015164186 A | 9/2015 | | |
| WO | WO-2013018238 A1 * | 2/2013 | ............ | H01L 24/43 |
| WO | WO-2013076548 A1 | 5/2013 | | |
| WO | WO-2014178792 A1 | 11/2014 | | |

OTHER PUBLICATIONS

Extended European Search Report issued in EP18210700.3 dated Jan. 7, 2019.
Extended European Search Report issued in EP19174284.0 dated Jun. 21, 2019.
Extended European Search Report issued in EP19174279.0 dated Jun. 21, 2019.
Extended European Search Report issued in EP19174294.9 dated Jun. 21, 2019.

* cited by examiner

COATED WIRE

The invention relates to a coated wire comprising a silver or silver-based core and a coating layer superimposed on the surface of the core. The invention further relates to a process for manufacturing such coated wire.

The use of bonding wires in electronics and microelectronics applications is well-known state of the art. While bonding wires were made from gold in the beginning, nowadays less expensive materials are used such as copper, copper alloys, silver and silver alloys. Such wires may have a metal coating.

With respect to wire geometry, most common are bonding wires of circular cross-section and bonding ribbons which have a more or less rectangular cross-section. Both types of wire geometries have their advantages making them useful for specific applications.

DETAILED DESCRIPTION

Figure 1:
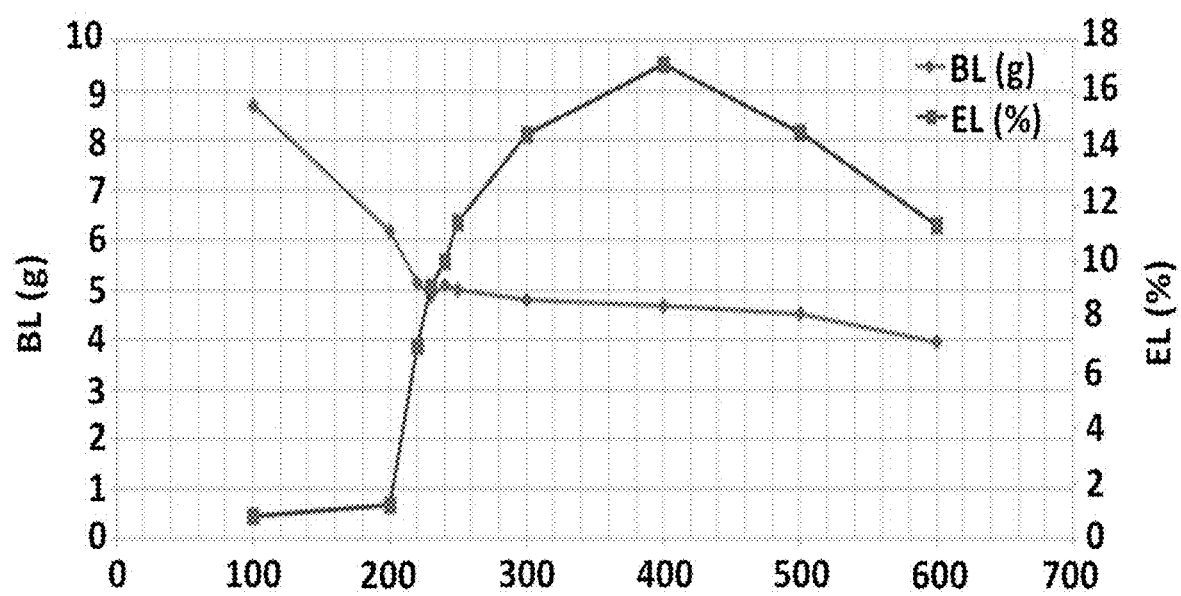
FIG. 1 shows an exemplary annealing curve of a 103 nm gold coated 4N silver core wire of 17.5 μm diameter.

It is an object of the invention to provide a coated silver or silver alloy wire suitable for use in wire bonding applications, the wire being improved in particular in FAB (free air ball) formation even under air atmosphere without a need for purging the FAB with inert or reducing gas, FAB softness, bondability and corrosion and oxidation resistance, but also exhibiting an overall well-balanced spectrum of properties which are relevant with regard to the wire and its bonding applications including, for example, a wide stitch bonding window, formation of axi-symmetrical FAB with good reproducibility, high stitch pull strength, soft wire, low electrical resistivity, low electro-migration, long floor life, etc.

The term "axi-symmetrical FAB" is used herein. It means a solidified spherical FAB which does not show any of the following defects:
  pointed tip (outflow of molten metal at the FAB tip),
  apple-bite tip (inflow of molten metal at the FAB tip),
  peach tip (two plateaus with distinct hemisphere at FAB tip),
  FAB tilted from wire axis with an angle of less than 5°, preferably ≤1°.

The term "spherical FAB" is used herein. It shall not be understood absolute; rather, it shall be understood to include FAB of true spherical shape as well as FAB of essentially spherical shape, i.e. FAB exhibiting an aspect ratio (quotient of the longest and the shortest diagonal (or diameter) along the FAB radial axes) in the range of from 1:1 (true spherical) to 1.1:1 (essentially spherical).

A contribution to the solution of said object is provided by the subject-matter of the category-forming claims. The dependent sub-claims of the category-forming claims represent preferred embodiments of the invention, the subject-matter of which also makes a contribution to solving the objects mentioned above.

In a first aspect, the invention relates to a wire comprising a wire core (hereinafter also called "core" for short) with a surface, the wire core having a coating layer superimposed on its surface, wherein the wire core itself consists of:

(a) pure silver consisting of (a1) silver in an amount in the range of from 99.99 to 100 wt.-% (weight-%, % by weight) and (a2) further components (components other than silver) in a total amount of from 0 to 100 wt.-ppm (weight-ppm, ppm by weight)
or
(b) doped silver consisting of (b1) silver in an amount in the range of from 99.69 to 99.987 wt.-%, preferably 99.93 to 99.987 wt.-%, (b2) at least one doping element selected from the group consisting of calcium, nickel, platinum, copper, rhodium and ruthenium, preferably consisting of calcium and nickel, in a total amount of from 30 to 3000 wt.-ppm, preferably 30 to 600 wt.-ppm, and (b3) further components (components other than silver, calcium, nickel, platinum, copper, rhodium and ruthenium) in a total amount of from 0 to 100 wt.-ppm
or
(c) a silver alloy consisting of (c1) silver in an amount in the range of from 95.99 to 99.49 wt.-%, preferably 97.49 to 99.09 wt.-%, (c2) palladium in an amount in the range of from 0.5 to 4 wt.-%, preferably 0.9 to 2.5 wt.-%, and (c3) further components (components other than silver and palladium) in a total amount of from 0 to 100 wt.-ppm
or
(d) a silver alloy consisting of (d1) silver in an amount in the range of from 93.99 to 99.39 wt.-%, preferably 95.39 to 96.59 wt.-%, (d2) palladium in an amount in the range of from 0.5 to 4 wt.-%, preferably 2.7 to 3.3 wt.-%, (d3) gold in an amount in the range of from 0.1 to 2 wt.-%, preferably 0.7 to 1.3 wt.-%, and (d4) further components (components other than silver, palladium and gold) in a total amount of from 0 to 100 wt.-ppm
or
(e) a doped silver alloy consisting of (e1) silver in an amount in the range of from 93.69 to 99.387 wt.-%, preferably 95.33 to 96.587 wt.-%, (e2) palladium in an amount in the range of from 0.5 to 4 wt.-%, preferably 2.7 to 3.3 wt.-%, (e3) gold in an amount in the range of from 0.1 to 2 wt.-%, preferably 0.7 to 1.3 wt.-%, (e4) at least one doping element selected from the group consisting of calcium, nickel, platinum, copper, rhodium and ruthenium, preferably consisting of platinum, calcium and nickel, in a total amount of from 30 to 3000 wt.-ppm, preferably 30 to 600 wt.-ppm, and (e5) further components (components other than silver, palladium, gold, calcium, nickel, platinum, copper, rhodium and ruthenium) in a total amount of from 0 to 100 wt.-ppm,
wherein the individual amount of any further component is less than 30 wt.-ppm,
wherein the individual amount of any doping element is at least 30 wt.-ppm,
wherein all amounts in wt.-% and wt.-ppm are based on the total weight of the core, and
wherein the coating layer is a 1 to 1000 nm, preferably 10 to 460 nm thick single-layer of gold or palladium or a double-layer comprised of a 1 to 100 nm, preferably 1 to 20 nm thick inner layer of nickel or palladium and an adjacent 1 to 200 nm, preferably 1 to 40 nm thick outer layer (top layer) of gold.

The wire of the invention is preferably a bonding wire for bonding in microelectronics. It is preferably a one-piece object. Numerous shapes are known and appear useful for wires of the invention. Preferred shapes are—in cross-sectional view—round, ellipsoid and rectangular shapes. For the invention, the term "bonding wire" comprises all shapes of cross-sections and all usual wire diameters, though bonding wires with circular cross-section and thin diameters are preferred. The average cross-section is in the range of for example from 50 to 5024 µm² or preferably 110 to 2400 µm²; accordingly in case of the preferred circular cross-sections, the average diameter is in the range of for example from 8 to 80 µm or preferably 12 to 55 µm.

The average diameter or, simply stated, the diameter of a wire or wire core can be obtained by the "sizing method". According to this method the physical weight of the wire for a defined length is determined. Based on this weight, the diameter of a wire or wire core is calculated using the density of the wire material. The diameter is calculated as arithmetic mean of five measurements on five cuts of a particular wire.

In line with the aforementioned, the wire core consists of (a) pure silver, (b) doped silver, (c) and (d) a silver alloy, or (e) a doped silver alloy, in each case with the afore disclosed composition. The core of the wire of the invention may comprise so-called further components in a total amount in the range of from 0 to 100 wt.-ppm, for example 10 to 100 wt.-ppm. In the present context, the further components, often also referred as "inevitable impurities", are minor amounts of chemical elements and/or compounds which originate from impurities present in the raw materials used or from the wire manufacturing process. The low total amount of 0 to 100 wt.-ppm of the further components ensures a good reproducibility of the wire properties. Further components present in the core are usually not added separately. Each individual further component is comprised in an amount of less than 30 wt.-ppm, based on the total weight of the wire core.

The core of the wire is a homogeneous region of bulk material. Since any bulk material always has a surface region which might exhibit different properties to some extent, the properties of the core of the wire are understood as properties of the homogeneous region of bulk material. The surface of the bulk material region can differ in terms of morphology, composition (e.g. sulfur, chlorine and/or oxygen content) and other features. The surface is an interface region between the wire core and the coating layer superimposed on the wire core. Typically, the coating layer is completely superimposed on the wire core's surface. In the region of the wire between its core and the coating layer superimposed thereon a combination of materials of both, the core and the coating layer, can be present.

The coating layer superimposed on the surface of the wire is a 1 to 1000 nm, preferably 10 to 460 nm and more preferably 10 to 200 nm thick single-layer of gold or palladium or a double-layer comprised of a 1 to 100 nm, preferably 1 to 20 nm thick inner layer of nickel or palladium and an adjacent 1 to 200 nm, preferably 1 to 40 nm thick outer layer of gold. In this context the term "thick" or "coating layer thickness" means the size of the coating layer in perpendicular direction to the longitudinal axis of the core.

Concerning the composition of the single-layer of gold or palladium, the gold or palladium content thereof is, for example, at least 50 wt.-%, preferably at least 95 wt.-%, based on the total weight of the coating layer. Particularly preferred, the coating layer consists of pure gold or palladium. Pure gold or palladium usually has less than 1 wt.-% of further components (components other than the gold or the palladium), based on the total weight of the coating layer.

Concerning the composition of said double-layer, the nickel or the palladium content of its inner layer is, for example, at least 50 wt.-%, preferably at least 95 wt.-%, based on the total weight of the inner coating layer. Particularly preferred, the inner coating layer consists of pure nickel or palladium. Pure nickel or palladium usually has less than 1 wt.-% of further components (components other than the nickel or the palladium), based on the total weight of the inner coating layer. The gold content of the adjacent outer gold layer is, for example, at least 50 wt.-%, preferably at least 95 wt.-%, based on the total weight of the outer coating layer. Particularly preferred, the outer coating layer consists of pure gold. Pure gold usually has less than 1 wt.-% of further components (components other than gold), based on the total weight of the outer coating layer.

In an embodiment, the core of the wire of the invention is characterized at least by one of the following intrinsic properties (1) to (6) (see "Test method A" as described below):

(1) The average wire grain size (average grain size) is not more than 10 µm, for example in the range of from 2 to 10 µm, preferably in the range of from 2 to 5 µm, (2) The wire grain [100] or [101] or [111] plane of orientation is not more than 15%, for example in the range of from 2 to 15%, preferably in the range of from 2 to 7%, (3) The wire twin boundary fraction is not more than 70%, for example in the range of from 50 to 70%, preferably in the range of from 50 to 60%, (4) The FAB average grain size is not more than 30 µm, for example in the range of from 8 to 30 µm, preferably in the range of from 8 to 16 µm, (5) The FAB grain [111] plane of orientation is not more than 30%, for example in the range of from 10 to 30%, preferably in the range of from 10 to 20%, (6) The FAB twin boundary fraction is not more than 50%, for example in the range of from 40 to 50%.

In an embodiment, the wire of the invention is characterized at least by one of the following extrinsic properties ($\alpha$) to ($\theta$):

($\alpha$) The corrosion resistance has a value of not more than 5% bonded ball lift, for example in the range of from 0 to 5% (see "Test method B" as described below), ($\beta$) The moisture resistance has a value of not more than 5% bonded ball lift, for example in the range of from 0 to 5% (see "Test method C" as described below), ($\gamma$) The resistivity of the wire is less than 4.0 µΩ·cm, for example in the range of from 1.6 to 4.0 µΩ·cm, preferably in the range of from 1.63 to 3.4 µΩ·cm (see "Test method D" as described below), ($\delta$) The wire's silver dendritic growth is not more than 12 µm/s, for example in the range of from 0 to 12 µm/s, preferably in the range of from 0 to 4 µm/s (see "Test method E" as described below), ($\epsilon$) The hardness of the wire core is not more than 80 HV (10 mN/12 s), for example in the range of from 50 to 80 HV, preferably in the range of from 50 to 70 HV (see "Test method F" as described below), ($\zeta$) The process window area for stitch bonding has a value of at least 36100 mA·g, for example 36100 to 38000 mA·g for a wire of 17.5 µm in diameter stitch bonded to a gold finger (see "Test method G" as described below), ($\eta$) The process window area for ball bonding has a value of at least 960 mA·g, for example 960 to 1000 mA·g for a wire of 17.5 µm in diameter ball bonded to an Al-0.5 wt.-% Cu bond pad (see "Test method H" as described below), ($\theta$) The yield strength of the wire is not more than 170 MPa, for example in the range of from 140 to 170 MPa (see "Test method J" as described below).

The terms "intrinsic property" and "extrinsic property" are used herein with regard to a wire core or a FAB. Intrinsic properties mean properties which a wire core or a FAB has of itself (independently of other factors), while extrinsic properties depend on the wire core's or FAB's relationship with other factors like a measuring method and/or measuring conditions employed.

The coated wire of the invention has the unexpected advantage that it allows for the formation of axi-symmetrical FAB even under air atmosphere; i.e. without a need for purging with inert or reducing gas during the FAB formation process.

In another aspect, the invention relates also to a process for the manufacture of the coated wire of the invention in any of its embodiments disclosed above. The process comprises at least the steps (1) to (5):

(1) providing a precursor item consisting of
(a) pure silver consisting of (a1) silver in an amount in the range of from 99.99 to 100 wt.-% and (a2) further components (components other than silver) in a total amount of from 0 to 100 wt.-ppm
or
(b) doped silver consisting of (b1) silver in an amount in the range of from 99.69 to 99.987 wt.-%, preferably 99.93 to 99.987 wt.-%, (b2) at least one doping element selected from the group consisting of calcium, nickel, platinum, copper, rhodium and ruthenium, preferably consisting of calcium and nickel, in a total amount of from 30 to 3000 wt.-ppm, preferably 30 to 600 wt.-ppm, and (b3) further components (components other than silver, calcium, nickel, platinum, copper, rhodium and ruthenium) in a total amount of from 0 to 100 wt.-ppm
or
(c) a silver alloy consisting of (c1) silver in an amount in the range of from 95.99 to 99.49 wt.-%, preferably 97.49 to 99.09 wt.-%, (c2) palladium in an amount in the range of from 0.5 to 4 wt.-%, preferably 0.9 to 2.5 wt.-%, and (c3) further components (components other than silver and palladium) in a total amount of from 0 to 100 wt.-ppm
or
(d) a silver alloy consisting of (d1) silver in an amount in the range of from 93.99 to 99.39 wt.-%, preferably 95.39 to 96.59 wt.-%, (d2) palladium in an amount in the range of from 0.5 to 4 wt.-%, preferably 2.7 to 3.3 wt.-%, (d3) gold in an amount in the range of from 0.1 to 2 wt.-%, preferably 0.7 to 1.3 wt.-%, and (d4) further components (components other than silver, palladium and gold) in a total amount of from 0 to 100 wt.-ppm
or
(e) a doped silver alloy consisting of (e1) silver in an amount in the range of from 93.69 to 99.387 wt.-%, preferably 95.33 to 96.587 wt.-%, (e2) palladium in an amount in the range of from 0.5 to 4 wt.-%, preferably 2.7 to 3.3 wt.-%, (e3) gold in an amount in the range of from 0.1 to 2 wt.-%, preferably 0.7 to 1.3 wt.-%, (e4) at least one doping element selected from the group consisting of calcium, nickel, platinum, copper, rhodium and ruthenium, preferably consisting of platinum, calcium and nickel, in a total amount of from 30 to 3000 wt.-ppm, preferably 30 to 600 wt.-ppm, and (e5) further components (components other than silver, palladium, gold, calcium, nickel, platinum, copper, rhodium and ruthenium) in a total amount of from 0 to 100 wt.-ppm,
wherein the individual amount of any further component is less than 30 wt.-ppm,
wherein the individual amount of any doping element is at least 30 wt.-ppm,
wherein all amounts in wt.-% and wt.-ppm are based on the total weight of the precursor item,
(2) elongating the precursor item to form an elongated precursor item, until an intermediate cross-section in the range of from 7850 to 31400 pmt or an intermediate diameter in the range of from 100 to 200 μm, preferably 130 to 140 μm is obtained,
(3) depositing a single-layer coating of gold or palladium or a double-layer coating of an inner layer (base layer) of nickel or palladium and an adjacent outer layer (top layer) of gold on the surface of the elongated precursor item obtained after completion of process step (2),
(4) further elongating the coated precursor item obtained after completion of process step (3) until a desired final cross-section or diameter is obtained, and
(5) finally strand annealing the coated precursor obtained after completion of process step (4) at an oven set temperature in the range of from 200 to 600° C. for an exposure time in the range of from 0.4 to 0.8 seconds to form the coated wire,
wherein step (2) includes one or more sub-steps of intermediate batch annealing of the precursor item at an oven set temperature of from 400 to 800° C. for an exposure time in the range of from 50 to 150 minutes.

The term "strand annealing" is used herein. It is a continuous process allowing for a fast production of a wire with high reproducibility. In the context of the invention, strand annealing means that the annealing is done dynamically while the coated precursor to be annealed is pulled or moved through a conventional annealing oven and spooled onto a reel after having left the annealing oven. Here, the annealing oven is typically in the form of a cylindrical tube of a given length. With its defined temperature profile at a given annealing speed which may be chosen in the range of, for example, from 10 to 60 meters/minute the annealing time/oven temperature parameters can be defined and set.

The term "oven set temperature" is used herein. It means the temperature fixed in the temperature controller of the annealing oven. The annealing oven may be a chamber furnace type oven (in case of batch annealing) or a tubular annealing oven (in case of strand annealing).

This disclosure distinguishes between precursor item, elongated precursor item, coated precursor item, coated precursor and coated wire. The term "precursor item" is used for those wire pre-stages which have not reached the desired final cross-section or final diameter of the wire core, while the term "precursor" is used for a wire pre-stage at the desired final cross-section or the desired final diameter. After completion of process step (5), i.e. after the final strand annealing of the coated precursor at the desired final cross-section or the desired final diameter a coated wire in the sense of the invention is obtained.

In the first alternative, the precursor item as provided in process step (1) consists of (a) pure silver of the afore disclosed composition. Typically, such precursor item is in the form of a rod having a diameter of, for example, 2 to 25 mm and a length of, for example, 2 to 100 m. Such silver rod can be made by continuous casting silver using an appropriate mold, followed by cooling and solidifying.

In the second to fourth alternative, the precursor item as provided in process step (1) consists of (b) doped silver or of (c) a silver alloy or of (d) a silver alloy or of (e) a doped silver alloy, in each case of the afore disclosed composition. Such precursor items can be obtained by alloying, doping or alloying and doping silver with the desired amount of components (b2) or (c2) or (d2) and (d3) or (e2), (e3) and (e4). The doped silver or silver alloy or doped silver alloy can be prepared by conventional processes known to the person skilled in the art of metal alloys, for example, by melting together the components in the desired proportional ratio. In doing so, it is possible to make use of one or more conventional master alloys. The melting process can for example be performed making use of an induction furnace and it is expedient to work under vacuum or under an inert gas atmosphere. The materials used can have a purity grade of, for example, 99.99 wt.-% and above. The melt so-produced can be cooled to form a homogeneous piece of silver based precursor item. Typically, such precursor item is in the form of a rod having a diameter of, for example, 2 to 25 mm and a length of, for example, 2 to 100 m. Such rod can be made by continuous casting said doped silver or (doped) silver alloy melt using an appropriate mold, followed by cooling and solidifying.

In process step (2) the precursor item is elongated to form an elongated precursor item, until an intermediate cross-section in the range of from 7850 to 31400 µm$^2$ or an intermediate diameter in the range of from 100 to 200 µm, preferably 130 to 140 µm is obtained. Techniques to elongate a precursor item are known and appear useful in the context of the invention. Preferred techniques are rolling, swaging, die drawing or the like, of which die drawing is particularly preferred. In the latter case the precursor item is drawn in several process steps until the desired intermediate cross-section or the desired intermediate diameter is reached. Such wire die drawing process is well known to the person skilled in the art. Conventional tungsten carbide and diamond drawing dies may be employed and conventional drawing lubricants may be employed to support the drawing.

Step (2) of the process of the invention includes one or more sub-steps of intermediate batch annealing of the elongated precursor item at an oven set temperature in the range of from 400 to 800° C. for an exposure time in the range of from 50 to 150 minutes. The intermediate batch annealing may be performed, for example, with a rod drawn to a diameter of 2 mm and coiled on a drum.

In process step (3) a single-layer coating of gold or palladium or a double-layer coating comprised of an inner layer of nickel or palladium and an adjacent outer layer of gold is deposited on the surface of the elongated precursor item obtained after completion of process step (2) so as to superimpose the coating over said surface.

The skilled person knows how to calculate the thickness of such coating on an elongated precursor item to finally obtain the coating in the layer thickness disclosed for the embodiments of the wire, i.e. after finally elongating the coated precursor item. The skilled person knows numerous techniques for forming a coating layer of a material according to the embodiments on a silver or silver alloy surface. Preferred techniques are plating, such as electroplating and electroless plating, deposition of the material from the gas phase such as sputtering, ion plating, vacuum evaporation and physical vapor deposition, and deposition of the material from the melt. In the context of the invention electroplating is the preferred technique.

In process step (4) the coated precursor item obtained after completion of process step (3) is further elongated until the desired final cross-section or diameter of the wire is obtained. Techniques to elongate the coated precursor item are the same elongation techniques like those mentioned above in the disclosure of process step (2).

In process step (5) the coated precursor obtained after completion of process step (4) is finally strand annealed at an oven set temperature in the range of from 200 to 600° C., preferably 200 to 400° C. for an exposure time in the range of from 0.4 to 0.8 seconds to form the coated wire.

In a preferred embodiment, the finally strand annealed coated precursor, i.e. the still hot coated wire is quenched in water which, in an embodiment, may contain one or more additives, for example, 0.01 to 0.07 volume-% of additive(s). The quenching in water means immediately or rapidly, i.e. within 0.2 to 0.6 seconds, cooling the finally strand annealed coated precursor from the temperature it experienced in process step (5) down to room temperature, for example by dipping or dripping.

The intermediate batch annealing of process step (2) may be performed under an inert or reducing atmosphere. Numerous types of inert atmospheres as well as reducing atmospheres are known in the art and are used for purging the annealing oven. Of the known inert atmospheres, nitrogen or argon is preferred. Of the known reducing atmospheres, hydrogen is preferred. Another preferred reducing atmosphere is a mixture of hydrogen and nitrogen. Preferred mixtures of hydrogen and nitrogen are 90 to 98 vol.-% nitrogen and, accordingly, 2 to 10 vol.-% hydrogen, wherein the vol.-% total 100 vol.-%. Preferred mixtures of nitrogen/hydrogen are equal to 93/7, 95/5 and 97/3 vol.-%/vol.-%, each based on the total volume of the mixture.

It is believed that the unique combination of the composition of the precursor item material (which is the same as that of the wire core) and the annealing parameters prevailing during process steps (2) and (5) is essential to obtain the wire of the invention exhibiting at least one of the above disclosed intrinsic and/or extrinsic properties. The temperature/time conditions of the intermediate batch and the final strand annealing steps allow for achieving or adjusting intrinsic and extrinsic properties of the wire or wire core.

After completion of process step (5) and the optional quenching the coated wire of the invention is finished. In order to fully benefit from its properties, it is expedient to either use it immediately for wire bonding applications, i.e. without delay, for example, within no longer than 28 days after completion of process step (5). Alternatively, in order to keep the wire's wide wire bonding process window property and in order to prevent it from oxidative or other chemical attack, the finished wire is typically spooled and vacuum sealed immediately after completion of process step (5), i.e. without delay, for example, within <1 to 5 hours after completion of process step (5) and then stored for further use as bonding wire. Storage in vacuum sealed condition should not exceed 12 months. After opening the vacuum seal the wire should be used for wire bonding within no longer than 28 days.

It is preferred that all process steps (1) to (5) as well as spooling and vacuum sealing are carried out under clean room conditions (US FED STD 209E cleanroom standards, 1 k standard).

A third aspect of the invention is a coated wire obtainable by the afore disclosed process according to any embodiment thereof. It has been found that the coated wire of the invention is well suited for use as a bonding wire in wire bonding applications. Wire bonding technique is well known to the skilled person. In the course of wire bonding it is typical that a ball bond (1$^{st}$ bond) and a stitch bond (2$^{nd}$ bond, wedge bond) are formed. During bond forming a certain force (typically measured in grams) is applied, supported by application of ultrasonic energy (typically measured in mA). The mathematical product of the difference between the upper and the lower limits of the applied force and the difference between the upper and the lower limits of the applied ultrasonic energy in a wire bonding process defines the wire bonding process window:

(Upper limit of applied force−Lower limit of applied force)·(Upper limit of applied ultrasonic energy−Lower limit of applied ultrasonic energy)=Wire bonding process window.

The wire bonding process window defines the area of force/ultrasonic energy combinations which allow formation of a wire bond that meets specifications, i.e. which passes the conventional tests like conventional pull tests, ball shear test and ball pull test to name only few.

In other words, the 1$^{st}$ bond (ball bond) process window area is the product of the difference between the upper and the lower limits of the force used in the bonding and the difference between the upper and the lower limits of the applied ultrasonic energy, wherein the resulting bond has to meet certain ball shear test specifications, e.g. a ball shear of 0.0085 grams/μm$^2$, no non-stick on bond pad, etc., while the 2$^{nd}$ bond (stitch bond) process window area is the product of the difference between the upper and the lower limits of the force used in the bonding and the difference between the upper and the lower limits of the applied ultrasonic energy, wherein the resulting bond has to meet certain pull test specifications, e.g. a pull force of 2 grams, no non-stick on lead, etc.

For industrial applications it is desirable to have a wide wire bonding process window (force in g versus ultrasonic energy in mA) for reasons of wire bonding process robustness. The wire of the invention exhibits a considerably wide wire bonding process window.

The following non-limiting examples illustrate the invention. These examples serve for exemplary elucidation of the invention and are not intended to limit the scope of the invention or the claims in any way.

EXAMPLES

Preparation of FAB:

It was worked according to the procedures described in the KNS Process User Guide for FAB (Kulicke & Soffa Industries Inc, Fort Washington, Pa., USA, 2002, 31 May 2009). FAB was prepared by performing conventional electric flame-off (EFO) firing by standard firing (single step, 17.5 μm wire, EFO current of 50 mA, EFO time 125 μs).

Test Methods A. to J.

All tests and measurements were conducted at T=20° C. and a relative humidity RH=50%.

A. Electron Backscattered Diffraction (EBSD) Pattern Analysis:

The main steps adopted to measure wire texture were sample preparation, getting good Kikuchi pattern and component calculation:

The wires were first potted using epoxy resin and polished as per standard metallographic technique. Ion milling was applied in the final sample preparation step to remove any mechanical deformation of the wire surface, contamination and oxidation layer. The ion-milled cross-sectioned sample surface was sputtered with gold. Then ion milling and gold sputtering were carried out for two further rounds. No chemical etching or ion-etching was carried out.

The sample was loaded in a FESEM (field emission scanning electron microscope) with a 70° angled holder to the normal FESEM sample holding table surface. The FESEM was further equipped with an EBSD detector. The electron back-scattering patterns (EBSP) containing the wire crystallographic information were obtained.

These patterns were further analyzed for grain orientation fraction, average grain size, etc. (using a software called QUANTAX EBSD program developed by Bruker). Points of similar orientation were grouped together to form the texture component.

To distinguish different texture components, a maximum tolerance angle of 15° was used. The wire drawing direction was set as a reference orientation. The [100], [101] and [111] texture percentages were calculated by measurement of the percentage of crystals with [100], [101] and [111] plane of orientation parallel to the reference orientation.

Average grain sizes were analyzed defining the crystallographic orientation between neighboring grid points of greater than a minimum, herein 10°, to determine the position of grain boundaries. The EBSD software calculated the area of each grain and converted it to equivalent circle diameter, which is defined as "average crystal grain size". All the grains along the longitudinal direction of the wire within a length of ~100 μm were counted to determine mean and standard deviation of the average crystal grain size.

Twin boundaries (also called Σ3 CSL twin boundaries) were excluded in the average grain size calculation. The twin boundary was described by a 60° rotation about <111> plane of orientation between the neighboring crystallographic domains. The number of points depends on the step size, which was less than ⅕ of the average crystal grain size.

B. Salt-Solution Soaking Test of Bonded Balls:

The wires were ball bonded to Al-0.5 wt.-% Cu bond pads. The test devices with the so-bonded wires were soaked in salt-solution at 25° C. for 10 minutes, washed with deionized (DI) water and later with acetone. The salt-solution contained 20 wt.-ppm NaCl in DI water. The number of lifted balls were examined under a low power microscope (Nikon MM-40) at 100× magnification. Observation of a higher number of lifted balls indicated severe interfacial galvanic corrosion.

C. Moisture Resistance Test of Bonded Balls:

The wires were ball bonded to Al-0.5 wt.-% Cu bond pads. The test devices with the so-bonded wires were stored at 130° C. temperature, 85% relative humidity (RH) for 8 hours in a highly accelerated stress test (HAST) chamber and later examined for the number of lifted balls under a low power microscope (Nikon MM-40) at 100× magnification. Observation of a higher number of lifted balls indicated severe interfacial galvanic corrosion.

D. Electrical Resistivity:

Both ends of a test specimen, i.e. a wire of 1.0 meter in length, were connected to a power source providing a constant current/voltage. The resistance was recorded with a device for the supplied voltage. The measuring device was a HIOKI model 3280-10, and the test was repeated with at least 10 test specimens. The arithmetic mean of the measurements was used for the calculations given below.

The resistance R was calculated according to R=V/I.

The specific resistivity μ was calculated according to μ=(R×A)/L, wherein A is the mean cross-sectional area of the wire and L the length of the wire between the two measuring points of the device for measuring the voltage.

The specific conductivity σ was calculated according to σ=1/μ.

E. Electro-Migration Test of Wires:

Two wires of 75 μm diameter were kept parallel within a millimeter distance on a PTFE plate under the objective lens of a low power microscope Nikon MM40 model at 50× magnification. A water drop was formed by a micropipette between the two wires to be connected electrically. One wire was connected to a positive and the other to a negative pole and 5 V was given to the wires. The two wires were biased with 5 V direct current in a closed circuit, connected in series with a 10 kΩ resistor. The circuit was closed by wetting the two wires with a few drops of de-ionized water as an electrolyte. Silver electro-migrated from the cathode to the anode in the electrolyte forming silver dendrites, sometimes the two wires bridged. The rate of growth of silver dendrites strongly depended on the wires' coating layer and—in case of a silver alloy wire core—the alloying additions.

F. Vickers Micro-Hardness:

The hardness was measured using a Mitutoyo HM-200 testing equipment with a Vickers indenter. A force of 10 mN indentation load was applied to a test specimen of wire for a dwell time of 12 seconds. The testing was performed on the center of the wire or the FAB.

G. Stitch Bonding Process Window Area:

Measurements of the stitch bonding process window area were done by a standard procedure. The test wires were stitch bonded using a KNS-iConn bonder tool (Kulicke & Soffa Industries Inc., Fort Washington, Pa., USA). The process window values were based on a wire having an average diameter of 17.5 µm, wherein the lead finger to which the wire was bonded consisted of gold.

The four corners of the process window were derived by overcoming the two main failure modes:
(1) supply of too low force and ultrasonic energy lead to non-stick on lead finger (NSOL) of the wire, and
(2) supply of too high force and ultrasonic energy lead to short wire tail (SHTL).

H. Ball Bonding Process Window Area:

Measurements of the ball bonding process window area were done by a standard procedure. The test wires were ball bonded using a KNS-iConn bonder tool (Kulicke & Soffa Industries Inc., Fort Washington, Pa., USA). The process window values were based on a wire having an average diameter of 17.5 µm, wherein the bond pad to which the wire was bonded consisted of Al-0.5 wt.-% Cu.

The four corners of the process window were derived by overcoming the two main failure modes:
(1) supply of too low force and ultrasonic energy lead to non-stick on pad (NSOP) of the wire, and
(2) supply of too high force and ultrasonic energy lead to short wire tail (SHTL).

J. Elongation (EL):

The tensile properties of the wires were tested using an Instron-5564 instrument. The wires were tested at 2.54 cm/min speed, for 254 mm gauge length (L). The load and elongation on fracture (break) were acquired as per ASTM standard F219-96. The elongation was the difference in the gauge length (ΔL) of the wire between start and end of the tensile test, usually reported in percentage as (100·ΔL/L), calculated from the recorded load versus extension tensile plot. The tensile strength and the yield strength were calculated from the break and yield load divided by the wire area. The actual diameter of the wire was measured by the sizing method, weighing a standard length of the wire and using the density of it.

Example 1: Wire Samples 1 to 8

A quantity of silver (Ag), palladium (Pd) and gold (Au) of at least 99.99% purity ("4N") in each case were melted in a crucible. Small amounts of silver-nickel, silver-calcium, silver-platinum or silver-copper master alloys were added to the melt and uniform distribution of the added components was ascertained by stirring. The following master alloys were used:

| Master Alloy | Composition | |
|---|---|---|
| Ag-0.5 wt.-% Ni | 99.5 wt.-% Ag | 0.5 wt.-% Ni |
| Ag-0.5 wt.-% Ca | 99.5 wt.-% Ag | 0.5 wt.-% Ca |

-continued

| Master Alloy | Composition | |
|---|---|---|
| Ag-0.5 wt.-% Pt | 99.5 wt.-% Ag | 0.5 wt.-% Pt |
| Ag-0.5 wt.-% Cu | 99.5 wt.-% Ag | 0.5 wt.-% Cu |

For the alloys of Table 1 the corresponding combination of master alloys were added.

Then a wire core precursor item in the form of 8 mm rods was continuous cast from the melt. The rods were then drawn in several drawing steps to form a wire core precursor having a circular cross-section with a diameter of 134 µm. The wire core precursor was intermediate batch annealed at an oven set temperature of 500° C. for an exposure time of 60 minutes and then electroplated with a 775 nm thick coating layer consisting of gold of at least 99% purity and thereafter further drawn to a final diameter of 17.5 µm and a final gold coating layer thickness of 103 nm, followed by a final strand annealing at an oven set temperature of 220° C. for an exposure time of 0.6 seconds, immediately followed by quenching the so-obtained coated wires in water containing 0.07 vol.-% of surfactant.

By means of this procedure, several different samples 1 to 8 of gold coated silver and silver-based wires and an uncoated reference silver wire of 4N purity (Ref) were manufactured. Table 1 shows the composition of the wires.

TABLE 1

| | | wt.-% | | wt.-ppm | | | |
|---|---|---|---|---|---|---|---|
| Sample | | Au | Pd | Ni | Ca | Pt | Cu |
| 4N Ag (Ref) | uncoated | 0.0002 | 0.0002 | 2 | 2 | 2 | 2 |
| 1 (invention) | gold-coated | 0.0002 | 0.0002 | 2 | 2 | 2 | 2 |
| 2 (invention) | gold-coated | 0.0002 | 0.0002 | 2 | 2 | 500 | 2 |
| 3 (invention) | gold-coated | 0.0002 | 0.0002 | 2 | 2 | 2 | 200 |
| 4 (invention) | gold-coated | 0.0002 | 1 | 2 | 2 | 2 | 2 |
| 5 (invention) | gold-coated | 0.0002 | 2 | 2 | 2 | 2 | 2 |
| 6 (invention) | gold-coated | 1.0 | 3.0 | 2 | 2 | 2 | 2 |
| 7 (invention) | gold-coated | 1.0 | 3.0 | 2 | 50 | 2 | 2 |
| 8 (invention) | gold-coated | 1.0 | 3.0 | 30 | 50 | 2 | 2 |

The grain sizes of wire samples 1 to 8 were measured and the average grain sizes were reported. The result was in the range of 2 to 5 µm in each case. For sample 1, the average grain size was 3.12 µm.

Table 2 below shows certain test results. All tests were carried out with wires of 17.5 µm diameter, except for the electromigration test which was performed with wires of 75 µm diameter (Evaluation: ++++ Excellent, +++ Good, ++ Satisfactory, + Inferior)

TABLE 2

| | Sample | 4N Ag (Ref) | 1 | 2 | 3 | 4 | 5 | 6 | 7 | 8 |
|---|---|---|---|---|---|---|---|---|---|---|
| Mechanical properties | Elongation (%) | 7.5 | 7.5 | 7.5 | 7.5 | 7.5 | 7.5 | 7.5 | 7.5 | 7.5 |
| | Tensile strength (MPa) | 185 | 203 | 222 | 220 | 233 | 244 | 259 | 261 | 260 |
| | Yield strength (MPa) | 133 | 139 | 142 | 145 | 148 | 153 | 158 | 160 | 161 |
| | Micro-hardness, HV (10 mN/12 s) | 52 | 50 | 61 | 60 | 62 | 66 | 70 | 72 | 74 |
| Electrical properties | Resistivity ($\mu\Omega \cdot cm$) | 1.6 | 1.64 | 1.9 | 1.7 | 2.2 | 2.5 | 3.2 | 3.3 | 3.3 |
| Salt-solution soaking test of bonded balls | % bonded ball lift (forming gas purged) | 85 | 38 | 36 | 34 | 24 | 22 | 16 | 15 | 12 |
| | % bonded ball lift (under atmosphere) | 85 | 22 | 15 | 15 | 11 | 7 | 5 | 5 | 2 |
| Moisture resistance test of bonded balls | % bonded ball lift (forming gas purged) | 50 | 28 | 24 | 21 | 20 | 18 | 15 | 11 | 9 |
| | % bonded ball lift (under atmosphere) | 50 | 17 | 10 | 10 | 7 | 5 | 4 | 3 | 1 |
| Electro-migration test | Rate of growth of silver dendrites ($\mu m/s$) | 25 | 0.2 | 0.1 | 0.1 | 0.1 | 0.1 | 0.1 | 0.2 | 0.1 |
| FAB | Performance of FAB formation (forming gas purged) | +++ | ++++ | ++++ | ++++ | ++++ | ++++ | ++++ | ++++ | ++++ |
| | Performance of FAB formation (under atmosphere) | +++ | ++++ | ++++ | ++++ | ++++ | ++++ | ++++ | ++++ | ++++ |
| Bonding process window | 1st bond (ball bond) (mA · g) | N.A. | 960 | 960 | 960 | 960 | 960 | 960 | 960 | 960 |
| | 2nd bond (stitch bond) (mA · g) | 8100 | 36100 | 36100 | 36100 | 36100 | 36100 | 36100 | 36100 | 36100 |

"Forming gas purged" means that the FAB was purged with 95/5 vol.-%/vol.-% nitrogen/hydrogen during its formation, whereas "under atmosphere" means that FAB formation was performed under air atmosphere.

Figure 2:
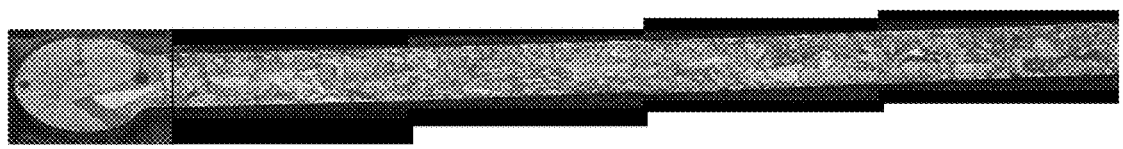
FIG. 2 shows an exemplary ion-milled cross-section image of a 100 nm gold coated 4N silver core wire of 17.5 μm diameter.

Typical ion-milled cross-section images are shown in FIG. 2 revealing the grain morphology in wire, HAZ (heat affected zone) and FAB locations. Table 3 shows the average grain size and texture component of wire sample 1 (wire, FAB and HAZ).

TABLE 3

| Texture Analysis | | | 4N Ag (Ref) | Sample 1 |
|---|---|---|---|---|
| [100] Orientation (area fraction, %) | FAB | Forming gas purged | 0.9 | 0.9 |
| | | Under atmosphere | N.A. | 1.4 |
| | HAZ | | 6.2 | 2.7 |
| | Wire | | 6.0 | 2.9 |
| [101] Orientation (area fraction, %) | FAB | Forming gas purged | 19.5 | 6.3 |
| | | Under atmosphere | N.A. | 11.6 |
| | HAZ | | 27.9 | 10.8 |
| | Wire | | 38.7 | 6.2 |
| [111] Orientation (area fraction, %) | FAB | Forming gas purged | 6.1 | 14.6 |
| | | Under atmosphere | N.A. | 13.1 |
| | HAZ | | 4.5 | 1.7 |
| | Wire | | 9.4 | 2.3 |
| Average Grain size ($\mu m$) | FAB | Forming gas purged | 11.6 | 13.3 |
| | | Under atmosphere | N.A. | 10.9 |
| | HAZ | | 4.28 | 3.99 |
| | Wire | | 2.92 | 3.12 |
| Fraction of twin Boundaries (%) | FAB | Forming gas purged | 73.6 | 44.8 |
| | | Under atmosphere | N.A. | 46 |
| | HAZ | | 76.2 | 63.2 |
| | Wire | | 70.0 | 56.2 |

Example 2: Wire Samples 9 to 12

It was worked in analogy to Example 1 using the following master alloys:

| Name of Master Alloy | Composition | |
|---|---|---|
| Ag-0.5 wt % Ni | 99.5 wt. % Ag | 0.5 wt. % Ni |
| Ag-0.5 wt % Ca | 99.5 wt. % Ag | 0.5 wt. % Ca |

Instead of electroplating with gold a 153 nm thick coating layer consisting of palladium was applied (final palladium layer thickness of 20 nm). Table 4 shows the compositions of wire samples 9 to 12.

TABLE 4

| | | wt.-% | | wt.-ppm | | | |
|---|---|---|---|---|---|---|---|
| Sample | | Au | Pd | Ni | Ca | Pt | Cu |
| 4N Ag (Ref) | uncoated | 0.0002 | 0.0002 | 2 | 2 | 2 | 2 |
| 9 (invention) | Pd-coated | 0.0002 | 0.0002 | 2 | 2 | 2 | 2 |
| 10 (invention) | Pd-coated | 1.0 | 3.0 | 2 | 2 | 2 | 2 |
| 11 (invention) | Pd-coated | 1.0 | 3.0 | 2 | 50 | 2 | 2 |
| 12 (invention) | Pd-coated | 1.0 | 3.0 | 30 | 50 | 2 | 2 |

Table 5 below shows certain test results. All tests were carried out with wires of 17.5 μm diameter, except for the electromigration test which was performed with wires of 75 μm diameter.

TABLE 5

|  | Sample | 4N Ag (Ref) | 9 | 10 | 11 | 12 |
|---|---|---|---|---|---|---|
| Mechanical properties | Elongation (%) | 7.5 | 7.5 | 7.5 | 7.5 | 7.5 |
|  | Tensile strength (MPa) | 185 | 203 | 264 | 263 | 265 |
|  | Yield strength (MPa) | 133 | 139 | 163 | 160 | 164 |
|  | Micro-hardness, HV (10 mN/12 s) | 52 | 50 | 70 | 72 | 74 |
| Electrical properties | Resistivity ($\mu\Omega \cdot cm$) | 1.6 | 1.64 | 3.3 | 3.3 | 3.3 |
| Salt-solution soaking test of bonded balls | % bonded ball lift (forming gas purged) | 85 | 20 | 5 | 2 | 2 |
| Moisture resistance test of bonded balls | % bonded ball lift (forming gas purged) | 50 | 15 | 5 | 2 | 2 |
| Electro-migration test | Rate of growth of silver dendrites ($\mu m/s$) | 25 | 12 | 2.9 | 2.7 | 2.4 |
| FAB | Performance of FAB formation (forming gas purged) | +++ | ++++ | ++++ | ++++ | ++++ |
| Bonding process window | 1st bond (ball bond) (mA · g) | 650 | 960 | 960 | 960 | 960 |
|  | 2nd bond (stitch bond) (mA · g) | 8100 | 36100 | 36100 | 36100 | 36100 |

Example 3: Wire Samples 13 to 17

It was worked in analogy to Example 1 using the following master alloys:

| Name of Master Alloy | Composition | |
|---|---|---|
| Ag-0.5 wt % Ni | 99.5 wt. % Ag | 0.5 wt. % Ni |
| Ag-0.5 wt % Ca | 99.5 wt. % Ag | 0.5 wt. % Ca |

Instead of electroplating with a single-layer of gold a double layer coating consisting of an inner palladium (or nickel) layer and an outer gold layer was applied (final palladium or nickel layer thickness=2.6 nm, final gold layer thickness=13 nm). Table 6 shows the compositions of wire samples 13 to 17.

TABLE 6

| Sample | | wt.-% | | wt.-ppm | | | |
|---|---|---|---|---|---|---|---|
|  |  | Au | Pd | Ni | Ca | Pt | Cu |
| 4N Ag (Ref) | Uncoated | 0.0002 | 0.0002 | 2 | 2 | 2 | 2 |
| 13 (invention) | Coating of inner palladium and outer gold layer | 0.0002 | 0.0002 | 2 | 2 | 2 | 2 |
| 14 (invention) | Coating of inner nickel and outer gold layer | 0.0002 | 0.0002 | 2 | 2 | 2 | 2 |
| 15 (invention) | Coating of inner nickel and outer gold layer | 0.0002 | 0.0002 | 2 | 2 | 500 | 2 |
| 16 (invention) | Coating of inner nickel and outer gold layer | 0.0002 | 1.0 | 2 | 2 | 2 | 2 |
| 17 (invention) | Coating of inner nickel and outer gold layer | 1.0 | 3.0 | 2 | 50 | 2 | 2 |

Table 7 below shows certain test results. All tests were carried out with wires of 17.5 μm diameter, except for the electromigration test which was performed with wires of 75 μm diameter.

TABLE 7

| | Sample | 4N Ag (Ref) | 13 | 14 | 15 | 16 | 17 |
|---|---|---|---|---|---|---|---|
| Mechanical properties | Elongation (%) | 7.5 | 7.5 | 7.5 | 7.5 | 7.5 | 7.5 |
| | Tensile strength (MPa) | 185 | 208 | 209 | 213 | 233 | 263 |
| | Yield strength (MPa) | 133 | 140 | 141 | 142 | 146 | 165 |
| | Micro-hardness, HV (10 mN/12 s) | 60 | 50 | 50 | 60 | 62 | 74 |
| Electrical properties | Resistivity (μΩ · cm) | 1.6 | 1.64 | 1.64 | 1.8 | 2.2 | 3.3 |
| Salt-solution soaking test of bonded balls | % bonded ball lift (forming gas purged) | 85 | 18 | 15 | 14 | 8 | 2 |
| Moisture resistance test of bonded balls | % bonded ball lift (forming gas purged) | 50 | 13 | 10 | 9 | 4 | 2 |
| Electro-migration test | Rate of growth of silver dendrites (μm/s) | 25 | 0.3 | 0.3 | 0.2 | 0.1 | 0.2 |
| FAB | Performance of FAB formation (forming gas purged) | +++ | ++++ | ++++ | ++++ | ++++ | ++++ |
| Bonding process window | 1st bond (ball bond) (mA · g) | 650 | 960 | 960 | 960 | 960 | 960 |
| | 2nd bond (stitch bond) (mA · g) | 8100 | 36100 | 36100 | 36100 | 36100 | 36100 |

DESCRIPTION OF FIGURES

FIG. 1 shows an exemplary annealing curve of a 103 nm gold coated 4N silver core wire of 17.5 μm diameter (corresponding to the composition of sample 1 of Table 1). The annealing temperature is the variable parameter of the x-axis. The graph shows the measured values of the break load (BL, in grams) and the elongation (EL, in %) of the wire. The elongation was determined by tensile testing. Elongation measurements exhibited a typical local maximum value of about 16.5% in the displayed example, which was achieved at an annealing temperature of around 400° C. The wire according to sample 1 was not annealed at this temperature of maximum elongation, but at 220° C., which was 180° C. below the temperature of the maximum elongation according to FIG. 1. This resulted in an elongation value of about 8%, which is more than 35% below the maximum elongation value.

FIG. 2 shows an exemplary ion-milled cross-section image of a 100 nm gold coated 4N silver core wire of 17.5 μm diameter (sample 1 of Table 1). The grain morphology of the three different locations wire, heat affected zone (HAZ) and FAB are evident. The FAB was formed using cherry pit mode. Ball to wire size ratio (BSR) was 1.8.

The invention claimed is:

1. A wire comprising a wire core with a surface and a coating layer superimposed on the surface, wherein
   the wire core consists of a silver alloy consisting of silver in an amount in the range of from 95.99 to 99.49 wt.-%, palladium in an amount in the range of from 0.5 to 4 wt.-%, and further components in a total amount of from 0 to 100 wt.-ppm,
   the individual amount of any further component is less than 30 wt.-ppm,
   all amounts in wt.-% and wt.-ppm are based on the total weight of the core, and
   the coating layer is a double-layer consisting of a 1 to 100 nm thick inner layer consisting of at least 95 wt.-% nickel and 5 wt.-% or less of further components and an adjacent 1 to 200 nm thick outer layer consisting of a least 95 wt.-% gold and 5 wt.-% or less of further components.

2. The wire of claim 1, wherein the wire has an average cross-section in the range of 50 to 5024 μm².

3. The wire of claim 1, wherein the wire has a circular cross-section with an average diameter in the range of 8 to 80 μm.

4. The wire of claim 1, wherein the wire core is characterized at least by one of the following intrinsic properties (1) to (6):
   (1) the average wire grain size is not more than 10 μm,
   (2) the wire grain [100] or [101] or [111] plane of orientation is not more than 15%,
   (3) the wire twin boundary fraction is not more than 70%,
   (4) the free air ball (FAB) average grain size is not more than 30 μm,
   (5) the FAB grain [111] plane of orientation is not more than 30%, and
   (6) the FAB twin boundary fraction is not more than 50%.

5. The wire of claim 1, being characterized at least by one of the following extrinsic properties (α) to (θ):
   (α) the corrosion resistance has a value of not more than 5% bonded ball lift,
   (β) the moisture resistance has a value of not more than 5% bonded ball lift,
   (γ) the resistivity of the wire is less than 4.0 μΩ·cm,
   (δ) the wire's silver dendritic growth is not more than 12 μm/s, (ε) the hardness of the wire core is not more than 80 HV (10 mN/12 s), (ζ) the process window area for stitch bonding has a value of at least 36100 mA·g for a wire of 17.5 μm in diameter stitch bonded to a gold finger, (η) the process window area for ball bonding has a value of at least 960 mA·g for a wire of 17.5 μm in diameter ball bonded to an Al-0.5 wt.-% Cu bond pad, and (θ) the yield strength of the wire is not more than 170 MPa.

6. The wire of claim 1, wherein the inner layer is 1 to 20 nm thick and the outer layer is 1 to 40 nm thick.

7. The wire of claim 1, wherein the inner layer is 1 to 20 nm thick.

8. The wire of claim 1, wherein the surface is an interface region between the wire core and the coating layer, the interface region made of a combination of the silver alloy and the at least 95 wt.-% nickel.

9. A process for the manufacture of a coated wire of claim 1, wherein the process comprises at least the steps (1) to (5):
   (1) providing a precursor item consisting of:
      a silver alloy consisting of silver in an amount in the range of from 95.99 to 99.49 wt.-%, palladium in an amount in the range of 0.5 to 4 wt.-%, and further components in a total amount of from 0 to 100 wt.-ppm;
      wherein the individual amount of any further component is less than 30 wt.-ppm,
      wherein all amounts in wt.-% and wt.-ppm are based on the total weight of the precursor item,
   (2) elongating the precursor item to form an elongated precursor item, until an intermediate cross-section in the range of from 7850 to 31400 μm² or an intermediate diameter in the range of from 100 to 200 μm is obtained,
   (3) depositing a double-layer coating of an inner layer and an adjacent outer layer on the surface of the elongated precursor item obtained after completion of process step (2), the inner layer consisting of at least 95 wt.-% nickel and 5 wt.-% or less of further components and an outer layer consisting of a least 95 wt.-% gold and 5 wt.-% or less of further components,
   (4) further elongating the coated precursor item obtained after completion of process step (3) until a desired final cross-section or diameter is obtained, and
   (5) strand annealing the coated precursor obtained after completion of process step (4) at an oven set temperature in the range of from 200 to 600° C. for an exposure time in the range of from 0.4 to 0.8 seconds to form the coated wire,
   wherein step (2) includes one or more sub-steps of intermediate batch annealing of the precursor item at an oven set temperature of from 400 to 800° C. for an exposure time in the range of from 50 to 150 minutes.

10. The process of claim 9, wherein the strand annealing is performed at an oven set temperature in the range of from 200 to 400° C.

11. The process of claim 9, wherein the strand annealed coated precursor is quenched in water which may contain one or more additives.

12. The process of claim 9, wherein the intermediate batch annealing of process step (2) is performed in an inert or reducing atmosphere.

13. A coated wire formed by a process according to claim 9.

14. A wire comprising a wire core with a surface, the wire core having a coating layer superimposed on its surface, wherein the wire core consists of:
   (a) pure silver consisting of (a1) silver in an amount in the range of from 99.99 to 100 wt.-% and (a2) further components in a total amount of from 0 to 100 wt.-ppm; or
   (b) doped silver consisting of (b1) silver in an amount in the range of from 99.69 to 99.987 wt.-%, (b2) at least one doping element selected from the group consisting of calcium, nickel, platinum, copper, rhodium and ruthenium, in a total amount of from 30 to 3000 wt.-ppm and (b3) further components in a total amount of from 0 to 100 wt.-ppm; or
   (c) a silver alloy consisting of (c1) silver in an amount in the range of from 93.99 to 99.39 wt.-%, (c2) palladium in an amount in the range of from 0.5 to 4 wt.-%, (c3) gold in an amount in the range of from 0.1 to 2 wt.-%, and (c4) further components in a total amount of from 0 to 100 wt.-ppm; or
   (d) a doped silver alloy consisting of (d1) silver in an amount in the range of from 93.69 to 99.387 wt.-%, (d2) palladium in an amount in the range of from 0.5 to 4 wt.-%, (d3) gold in an amount in the range of from 0.1 to 2 wt.-%, (d4) at least one doping element selected from the group consisting of calcium, nickel, platinum, copper, rhodium and ruthenium in a total amount of from 30 to 3000 wt.-ppm, and (d5) further components in a total amount of from 0 to 100 wt.-ppm,
   wherein the individual amount of any further component is less than 30 wt.-ppm,
   wherein the individual amount of any doping element is at least 30 wt.-ppm,
   wherein all amounts in wt.-% and wt.-ppm are based on the total weight of the core, and
   wherein the coating layer is a double-layer consisting of a 1 to 100 nm thick inner layer consisting of at least 95 wt.-% nickel and 5 wt.-% or less of further components and an adjacent 1 to 200 nm thick outer layer consisting of a least 95 wt.-% gold and 5 wt.-% or less of further components.

15. The wire of claim 14, wherein the inner layer is 1 to 20 nm thick.

16. The wire of claim 14, wherein the inner layer is 1 to 20 nm thick and the outer layer is 1 to 40 nm thick.

* * * * *